United States Patent [19]
Kawagoe

[11] Patent Number: 5,889,695
[45] Date of Patent: Mar. 30, 1999

[54] NONVOLATILE SEMICONDUCTOR MEMORY DEVICE REDUCED IN OCCUPY AREA OF MEMORY CELL

[75] Inventor: Tomoya Kawagoe, Hyogo, Japan

[73] Assignee: Mitsubishi Denki Kabushiki Kaisha, Tokyo, Japan

[21] Appl. No.: 45,045

[22] Filed: Mar. 20, 1998

[30] Foreign Application Priority Data

Oct. 2, 1997 [JP] Japan ................................ 9-269934

[51] Int. Cl.$^6$ ................................................ G11C 11/22
[52] U.S. Cl. .......................................... 365/145; 365/149
[58] Field of Search .................................. 365/145, 149, 365/63, 51

[56] References Cited

U.S. PATENT DOCUMENTS

| | | | |
|---|---|---|---|
| 4,888,733 | 12/1989 | Mobley | 365/145 |
| 5,629,888 | 5/1997 | Saito et al. | 365/145 |
| 5,751,628 | 5/1998 | Hirano et al. | 365/145 |
| 5,754,466 | 5/1998 | Arase | 365/145 |
| 5,768,182 | 6/1998 | Hu et al. | 365/145 |

FOREIGN PATENT DOCUMENTS 7-34315  4/1995  Japan .

*Primary Examiner*—Son T. Dinh
*Attorney, Agent, or Firm*—McDermott, Will & Emery

[57] ABSTRACT

A nonvolatile semiconductor memory cell includes four ferroelectric capacitors and six N channel MOS transistors. When data is to be written or read to or from a certain ferroelectric capacitor, corresponding two word lines are activated.

6 Claims, 5 Drawing Sheets

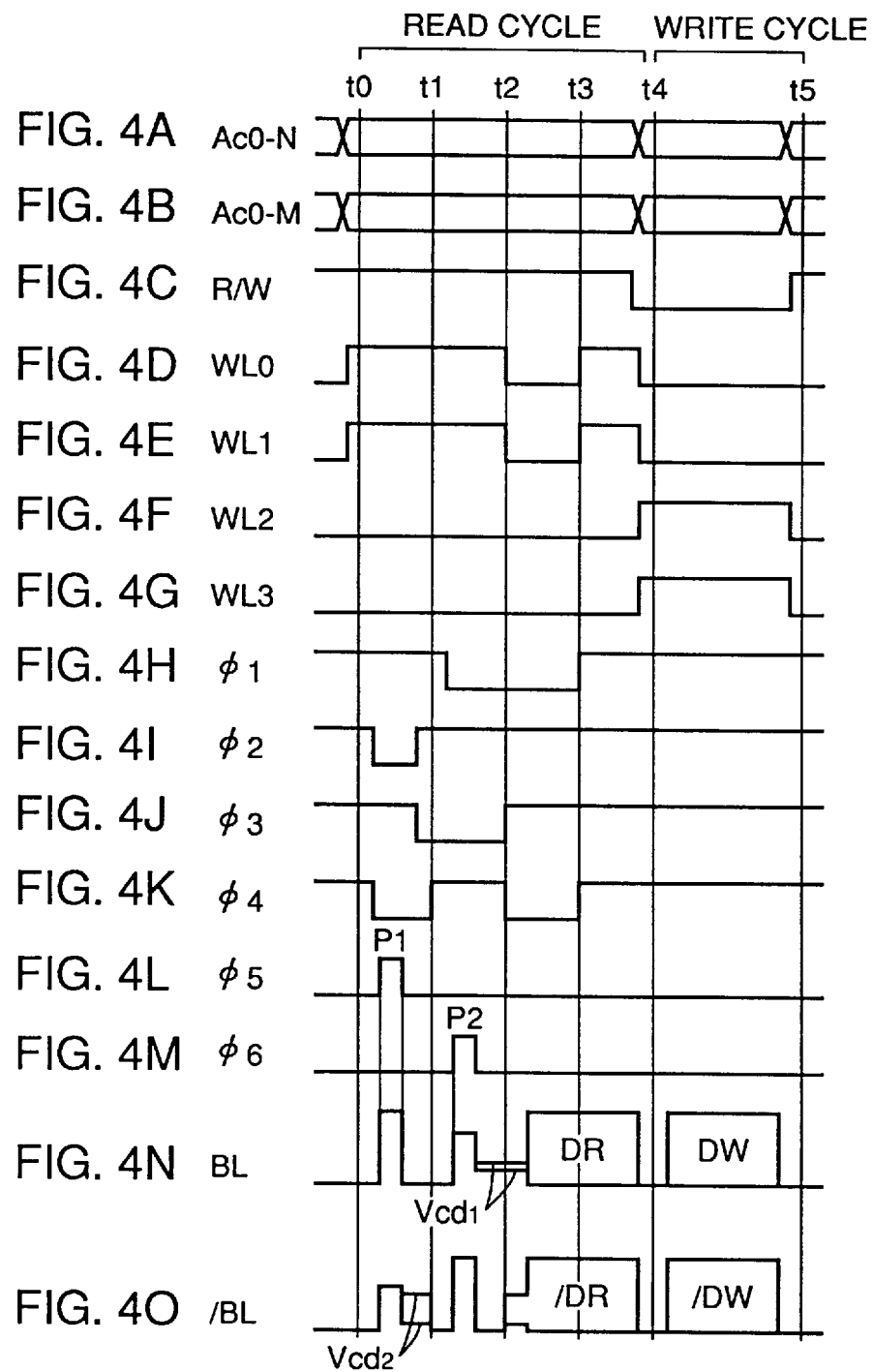

NONVOLATILE SEMICONDUCTOR MEMORY DEVICE REDUCED IN OCCUPY AREA OF MEMORY CELL

BACKGROUND OF THE INVENTION

1. Field of the Invention

The present invention relates to semiconductor memory devices, and more particularly, to a semiconductor memory device with a nonvolatile semiconductor memory cell.

2. Description of the Background Art

Prior art related to a nonvolatile semiconductor memory cell using a ferroelectric capacitor for a memory cell is disclosed in Japanese Patent Publication No. 7-34315. This is a nonvolatile semiconductor memory cell MC0 having a structure in which the electrodes at opposite sides of a ferroelectric capacitor C0 are connected to a first bit line BL and a second bit line /BL via a switching device (here, N channel MOS transistors NT1 and NT2), as shown in FIG. 7.

This conventional nonvolatile semiconductor memory cell MC0 has the advantage that noise and the like do not reach ferroelectric capacitor C0 since both ends of ferroelectric capacitor C0 are isolated from first and second bit lines BL and /BL by N channel MOS transistors NT1 and NT2.

Data is read out in a self-referencing manner in which data stored in ferroelectric capacitor C0 is determined on the basis of the polarization property thereof. Therefore, data can be read out stably even when the polarization property of ferroelectric capacitor C0 differs for each cell.

However, the conventional nonvolatile semiconductor memory cell shown in FIG. 7 requires two N channel MOS transistors NT1 and NT2 and one ferroelectric capacitor C0 to form one memory cell, i.e., to store data of 1 bit. This means that extra area is required in comparison to the case where one memory cell storing 1-bit data is formed of one transistor and one ferroelectric capacitor.

SUMMARY OF THE INVENTION

An object of the present invention is to provide a nonvolatile semiconductor memory device in which the number of transistors required to store data of 1 bit is reduced to reduce the area on the chip occupied by a memory cell.

According to an aspect of the present invention, a nonvolatile semiconductor memory device includes a first bit line, a second bit line, a first word line crossing the first and second bit lines, a second word line crossing the first and second bit lines, a third word line crossing the first and second bit lines, a first ferroelectric capacitor, a first transistor connected between the first bit line and the first ferroelectric capacitor, and having a gate connected to the first word line, a second transistor connected to the second bit line and the first ferroelectric capacitor, and having a gate connected to the second word line, a second ferroelectric capacitor connected between the second transistor and the first bit line, and a third transistor connected between the second ferroelectric capacitor and the first bit line, and having a gate connected to the third word line.

According to another aspect of the present invention, a nonvolatile semiconductor memory device includes a first bit line, a second bit line, a first word line crossing said first and second bit lines, a first transistor connected between the first and second bit lines, and having a gate connected to the first word line, a plurality of ferroelectric capacitors connected in parallel between the first transistor and the second bit line, a plurality of second transistors, each connected between the first transistor and any one of the plurality of ferroelectric capacitors, and a plurality of second word lines, each crossing the first and second bit lines, and connected to a gate of any one of the plurality of second transistors.

The present invention provides the advantage that the chip area can be reduced by reducing the number of transistors required for storing information of 1 bit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4O are timing charts for describing an operation of the nonvolatile semiconductor memory device shown in FIG. 2.

DESCRIPTION OF THE PREFERRED EMBODIMENTS

Figure 1:
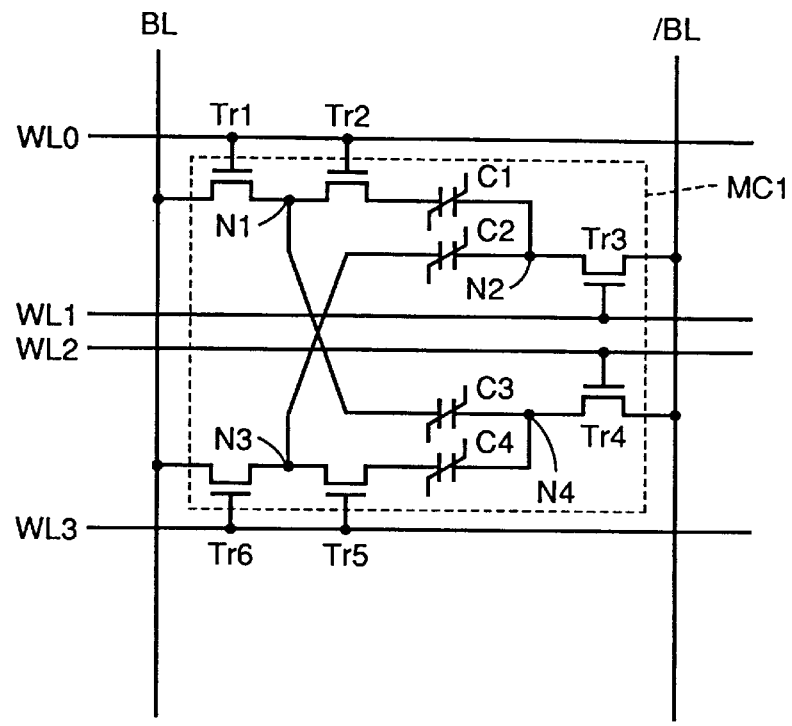
FIG. 1 is a circuit diagram showing a structure of a nonvolatile semiconductor memory cell in a nonvolatile semiconductor memory device according to a first embodiment of the present invention.

Embodiments of the present invention will be described hereinafter with reference to the drawings. In the drawings, the same reference characters denote the same or corresponding components.

First Embodiment

FIG. 1 is a circuit diagram showing a structure of a nonvolatile semiconductor memory cell corresponding to 4 bits in a nonvolatile semiconductor memory device according to a first embodiment of the present invention.

Referring to FIG. 1, a nonvolatile semiconductor memory cell MC1 includes nodes N1–N4, an N channel MOS transistor Tr1 connected between a bit line BL and node N1, and having a gate connected to a word line WL0, an N channel MOS transistor Tr2 having a source/drain connected to node N1 and a gate connected to word line WL0, a ferroelectric capacitor C1 connected between node N2 and N channel MOS transistor Tr2, an N channel MOS transistor Tr3 connected between node N2 and a bit line /BL, and having a gate connected to word line WL1, a ferroelectric capacitor C2 connected between nodes N2 and N3, an N channel MOS transistor Tr6 connected between node N3 and bit line BL, and having a gate connected to a word line WL3, a ferroelectric capacitor C3 connected between nodes N1 and N4, an N channel MOS transistor Tr4 connected between node N4 and bit line /BL, and having a gate connected to word line WL2, a ferroelectric capacitor C4 connected to node N4, and an N channel MOS transistor Tr5 connected between node N3 and ferroelectric capacitor C4, and having a gate connected to word line WL3.

Figure 7:
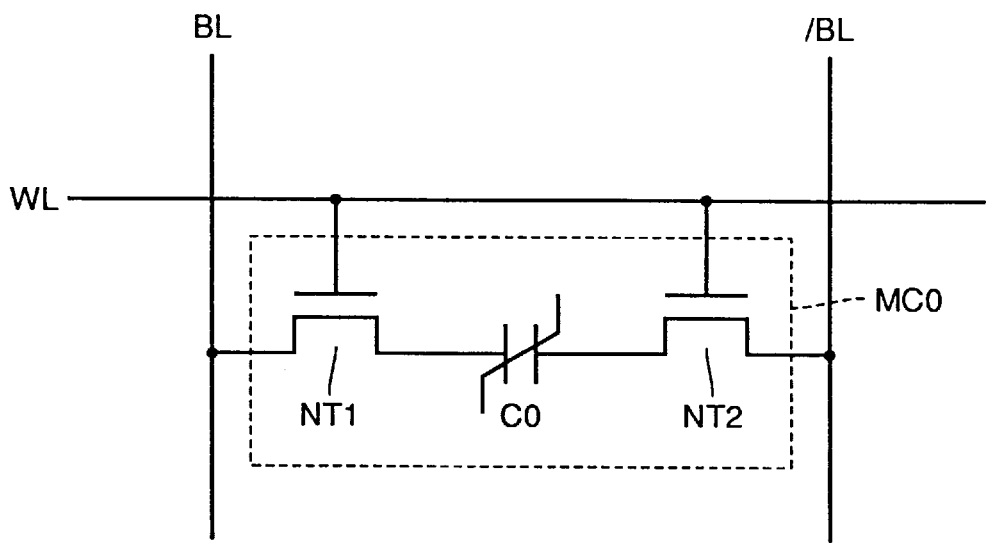
FIG. 7 is a circuit diagram showing a structure of a conventional nonvolatile semiconductor memory cell.

Nonvolatile semiconductor memory cell MC1 stores the information of 4 bits as a whole since each of ferroelectric capacitors C1–C4 stores information of 1 bit. Therefore, the number of N channel MOS transistors required to store information of 1 bit is 1.5. This means that there is a reduction of 0.5 transistors per bit in comparison to the conventional case shown in FIG. 7 where 2 nonvolatile semiconductor memory cells MC0 is required.

Therefore, the area of the chip occupied by the memory cells can be reduced by adopting nonvolatile semiconductor memory cell MC1 shown in FIG. 1.

Each of ferroelectric capacitors C1–C4 in nonvolatile semiconductor memory cell MC1 is isolated from bit lines BL and /BL by N channel MOS transistors Tr1–Tr6. Therefore, the memory cell is not easily susceptible to the effect of noise caused by access to another ferroelectric capacitor, likewise the conventional nonvolatile semiconductor memory cell MC0 shown in FIG. 7. Therefore, data can be read out stably.

Figure 2:
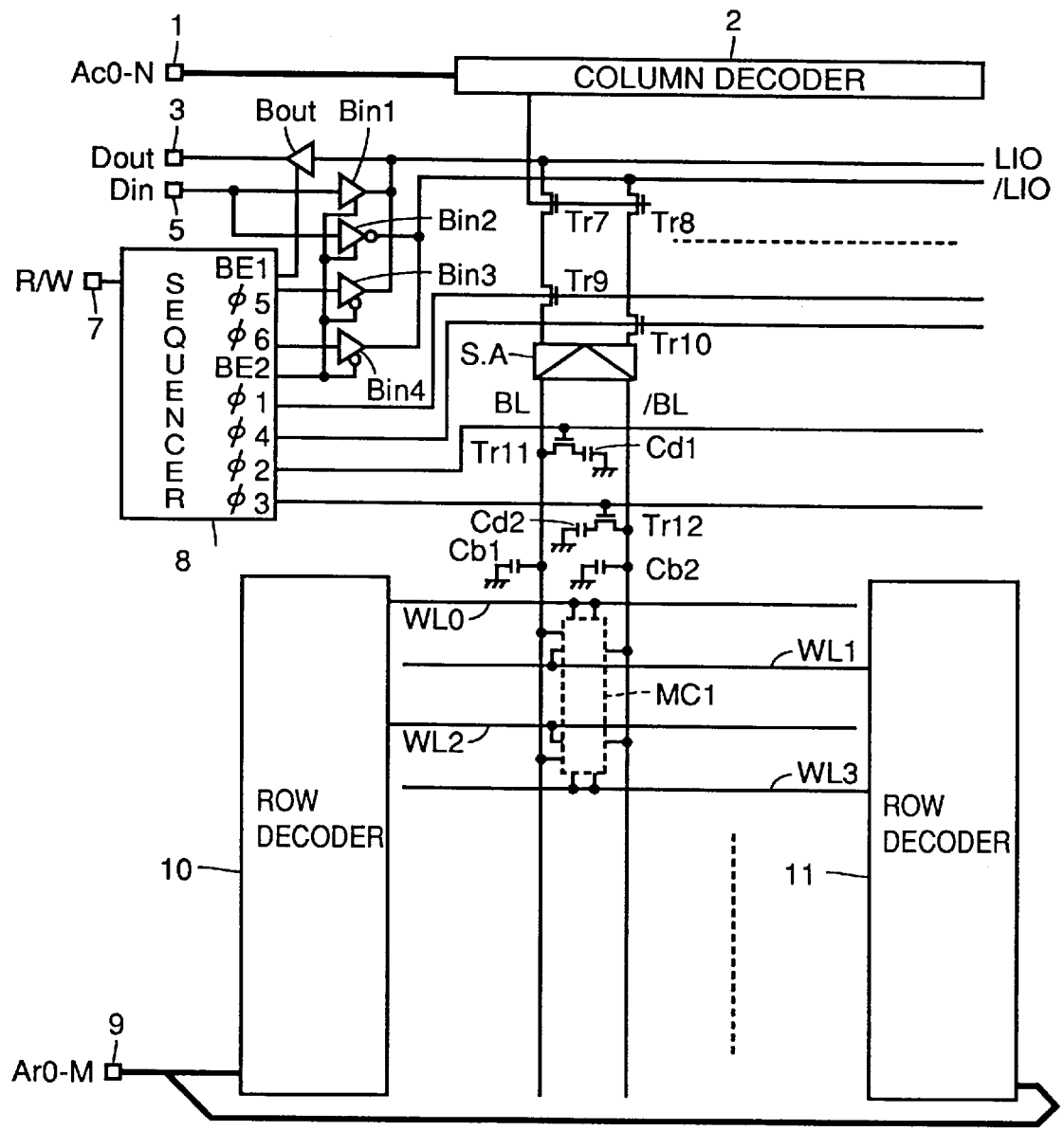
FIG. 2 shows a structure of the nonvolatile semiconductor memory device according to the first embodiment of the present invention.

FIG. 2 shows an entire structure of a nonvolatile semiconductor memory device including nonvolatile semiconductor memory cell MC1 of FIG. 1.

Referring to FIG. 2, the nonvolatile semiconductor memory device includes a word line WLn (n is an integer of at least 0), bit lines BL and /BL crossing word line WLn, a nonvolatile semiconductor memory cell MC1 connected to word lines WL0–WL3 and bit lines BL and /BL, a terminal 1 for entering a column address select signal Ac0-N, column decoder 2 connected to terminal 1, and responsive to a column address select signal Ac0-N applied to terminal 1 for connecting a pair of bit lines BL and /BL to data input/output lines LIO and /LIO, a terminal 9 for entering a row address select signal Ar0-M, a row decoder 10 connected to terminal 9 for rendering one even numbered word line $WL_{2n}$ (n is an integer of at least 0) to an H level (high level: logical high) according to row address select signal Ar0-M applied to terminal 9, a row decoder 11 connected to terminal 9 for rendering one odd numbered word line $WL_{2n+1}$ (n is an integer of at least 0) to an H level according to row address select signal Ar0-M applied to terminal 9, a terminal 3 for providing data Dout, a buffer Bout connected to terminal 3, a terminal 5 for applying data Din, buffers Bin1 and Bin2 connected to terminal 5, a terminal 7 for applying a signal R/W for selecting readout (output) or writing (input) of data, a sequencer 8 connected to terminal 7 for providing signals BE1, BE2, $\phi1$–$\phi6$ according to signal R/W provided to terminal 7, and buffers Bin3 and Bin4 connected to sequencer 8.

The nonvolatile semiconductor memory device includes an N channel MOS transistor Tr7 connected between bit line BL and data input/output line LIO, a sense amplifier S.A connected to bit lines BL and /BL for amplifying the potential difference therebetween, an N channel MOS transistor Tr9 connected between N channel MOS transistor Tr7 and sense amplifier S.A, and having a gate supplied with signal $\phi1$, an N channel MOS transistor Tr8 connected between bit line /BL and data input/output line LIO, an N channel MOS transistor Tr10 connected between N channel MOS transistor Tr8 and sense amplifier S.A, and having a gate supplied with signal $\phi4$, a capacitor Cd1 having one electrode grounded, an N channel MOS transistor Tr11 connected between bit line BL and capacitor Cd1, and having a gate supplied with signal $\phi2$, a capacitor Cd2 having one electrode grounded, an N channel MOS transistor Tr12 connected between bit line /BL and capacitor Cd 2, and having a gate supplied with signal $\phi3$, a capacitor Cb1 connected between a ground node and a bit line BL, and a capacitor Cb2 connected between the ground node and bit line /BL.

Figure 3:
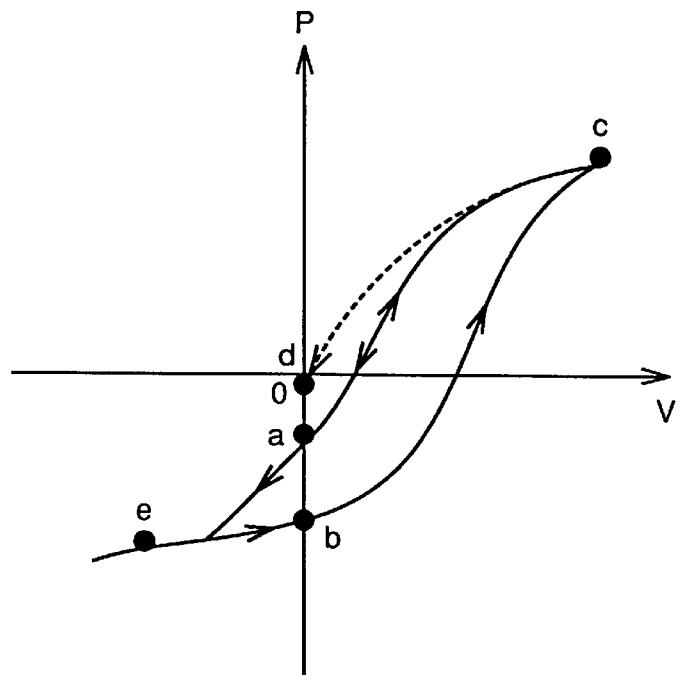
FIG. 3 is a graph showing the polarization property (hysteresis curve) of the ferroelectric capacitor of FIG. 1.

FIG. 3 shows the polarization property (hysteresis curve) of ferroelectric capacitors C1–C4. In FIG. 3, the voltage applied across both electrodes (plates) of ferroelectric capacitors C1–C4 is plotted along the abscissa, and the polarity, i.e., the charge accumulated on the plate of ferroelectric capacitors C1–C4 is plotted along the ordinate. The hysteresis curve shown in FIG. 3 crosses the ordinate at points b and a, and is not symmetric around the coordinate axis. Such a hysteresis curve is obtained when ferroelectric capacitors C1–C4 are left at a certain state for a long time.

For example, when the voltage applied to ferroelectric capacitors C1–C4 is 0 volt (point b on the graph), and a positive voltage is applied thereafter, the polarity is driven towards point c on the hysteresis curve. The polarity returns to point a along the hysteresis curve in an ideal situation when that positive voltage is no longer applied. In contrast, when a negative voltage is applied to ferroelectric capacitors C1–C4, the polarity shows a transition from point a to point e on the graph corresponding to the applied negative voltage. The polarity returns to the state of point b on the graph when the negative voltage is no longer applied and brought back to 0 volt.

The operation of reading out data stored in ferroelectric capacitor C1 in nonvolatile semiconductor memory cell MC1 in the nonvolatile semiconductor memory device of FIG. 2 will be described hereinafter with reference to the timing charts of FIGS. 4A–4O.

At time t0, signal R/W supplied to terminal 7 is at an H level as shown in FIG. 4C. Row address select signal Ar0-M for selecting word lines WL0 and WL1 is supplied via terminal 9 to row decoders 10 and 11, as shown in FIG. 4B. This causes row decoders 10 and 11 to drive word lines WL0 and WO1 to an H level and the other word lines WL2 and WL3 to an L (low: logical low) level, as shown in FIGS. 4D–4G.

In response, N channel MOS transistors Tr1–Tr3 are turned on, whereby each electrode of ferroelectric capacitor C1 is connected to bit lines BL and /BL. The other ferroelectric capacitors C2–C4 each have one electrode attain a floating state since N channel MOS transistors Tr4–b Tr6 are turned off. Therefore, no voltage is applied across the electrodes of ferroelectric capacitors C2–b C4. The data written in ferroelectric capacitors C2–b C4 will not be output to bit lines BL and /BL, and data will not be written into ferroelectric capacitors C2–b C4 via bit lines BL and /BL.

Column address select signal Ac0-N shown in FIG. 4A for selecting bit lines BL and /BL to which nonvolatile semiconductor memory cell MC1 is connected is supplied to terminal 1. N channel MOS transistors Tr7 and Tr8 are turned on by column decoder 2, whereby bit lines BL and /BL are connected to data input/output lines LIO and /LIO. In a data read out mode (signal R/W at an H level), sequencer 8 provides a signal BE1 of an H level to activate buffer Bout when the data read out from nonvolatile semiconductor memory cell MC1 is amplified by sense amplifier S.A and output to data input/output line LIO. Also, sequencer 8 provides a signal BE2 of an L level to inactivate buffers Bin1 and Bin2 and to activate buffers Bin3 and Bin4.

Thus, a state where signals $\phi5$ and $\phi6$ are supplied to data input/output lines LIO and /LIO is achieved.

As shown in FIGS. 4H–4M, signals φ1–φ4 are at an H level and signals φ5 and φ6 are at an L level at time t0. Therefore, N channel MOS transistors Tr9–Tr12 are turned on, and capacitors Cd1, Cd2, Cb1, and Cb2 are precharged to an L level (0V).

Then, signals φ2 and φ4 are driven to an L level as shown in FIGS. 4I and 4K, whereby N channel MOS transistors Tr10 and Tr11 are turned off. In this situation, a pulse P1 of an H level is applied as signal φ5 as shown in FIG. 4L. When ferroelectric capacitor C1 initially at the state of point a in FIG. 3 is driven along the broken line to come to the state of point d in response to application of pulse P1, the voltage $V_{cd2}$ (voltage of bit line /BL) across capacitor Cd2 is represented by the following equation.

$$V_{cd2} = -(Qa-Qd)/(Cb2+Cd2) \quad (1)$$

where Qa is the charge at point a, Qd is the charge at point d, Cb2 is the capacitance of capacitor Cb2, and Cd2 is the capacitance of capacitor Cd2.

In the case where the state of point a matches the state of point d, voltage $V_{cd2}$ is 0 by equation (1).

When ferroelectric capacitor C1 initially at the state at point b in FIG. 3 arrives at the state of point a in response to application of pulse P1, the voltage $V_{cd2}$ (voltage of bit line /BL) across capacitor Cd2 is represented by the following equation.

$$V_{cd2} = -(Qb-Qa)/(Cb2+Cd2) \quad (2)$$

At time t1, sequencer 8 pulls up signals φ2 and φ4 to an H level as shown in FIGS. 4I and 4K, and pulls down signals φ1 and φ3 to an L level as shown in FIGS. 4H and 4J.

In response, N channel MOS transistors Tr10 and Tr11 are turned, and N channel MOS transistors Tr9 and Tr12 are turned off. In this state, a pulse P2 of an H level is applied as signal φ6, as shown in FIG. 4M. When ferroelectric capacitor C1 initially at the state of point a of FIG. 3 is driven to the state at point b via point e in response to application of pulse P2, the voltage $V_{cd1}$ across capacitor Cd1 (the voltage of bit line BL) is represented by the following equation.

$$V_{cd1} = (Qa-Qb)/(Cb1+Cd1) \quad (3)$$

When ferroelectric capacitor C1 initially at the state of point d of FIG. 3 is driven to the state of point b via point e after pulse P2 is applied, the voltage $V_{cd1}$ across capacitor Cd1 (the voltage of bit line BL) is represented by the following equation.

$$V_{cd1} = (Qd-Qb)/(Cb1+Cd1) \quad (4)$$

Thus, when ferroelectric capacitor C1 is at the initial state of point a in FIG. 3, the difference between voltage $V_{cd1}$ and voltage $V_{cd2}$ is represented by the following equation.

$$V_{cd1} - V_{cd2} = (Qa-Qb+\Delta)/2(Cb+Cd) \quad (5)$$

where capacitance Cb1=capacitance Cb2×2=capacitance Cb2×2, capacitance Cd1=capacitance Cd2×2=capacitance Cd×2, and Δ=Qa−Qd ~0.

When ferroelectric capacitor C1 is at the initial state at point b in FIG. 3, the difference between voltage $V_{cd1}$ and voltage $V_{cd2}$ is represented by the following equation.

$$V_{cd1} - V_{cd2} = -(Qa-Qb)/2(Cb+Cd) \quad (6)$$

It is appreciated that the difference between voltages $V_{cd1}$ and $V_{cd2}$ read out differ depending upon the data (state) stored in ferroelectric capacitor C1.

At time t2, row decoders 10 and 11 pull down word lines WL0–WL3 to an L level as shown in FIGS. 4D–4G. Sequencer 8 pulls up signals φ2 and φ3 to drive sense amplifier S.A, as shown in FIGS. 4I and 4J. Between time t2 and time t3, the difference between voltages $V_{cd1}$ and $V_{cd2}$ is amplified, and the readout data DR is output effectively to terminal 3 at the end of the amplification.

At time t3, row decoders 10 and 11 drive word lines WL0 and WL1 to an active state of an H level and the other word lines WL2 and WL3 to an inactive state of an L level. Thus, the initially written data is written into ferroelectric capacitor C1 again.

The above description applies to the case where data is to be read out from ferroelectric capacitor C1. The same applies by activating word lines WL1 and WL3, word lines WL0 and WL2, and word lines WL2 and WL3 to an H level when data is to be read out from ferroelectric capacitors C2, C3, and C4, respectively.

An operation of writing data into ferroelectric capacitor C4, for example, will be described hereinafter with reference to FIGS. 4A–4O.

First, signal R/W is driven to an L level to enter a write cycle as shown in FIG. 4C.

As shown in FIGS. 4D–4G, word lines WL2 and WL3 are activated to an H level and the other word lines WL0 and WL1 are driven to an L level when data is to be written into ferroelectric capacitor C4. In response, N channel MOS transistors Tr4–Tr6 are turned on, and the other N channel MOS transistors Tr1–Tr3 are turned off. Therefore, only both sides of ferroelectric capacitor C4 are connected to bit lines BL and /BL, whereby data DW and /DW are written into ferroelectric capacitor C4 via bit lines BL and /BL, as shown in FIGS. 4N and 4O.

Second Embodiment

Figure 5:
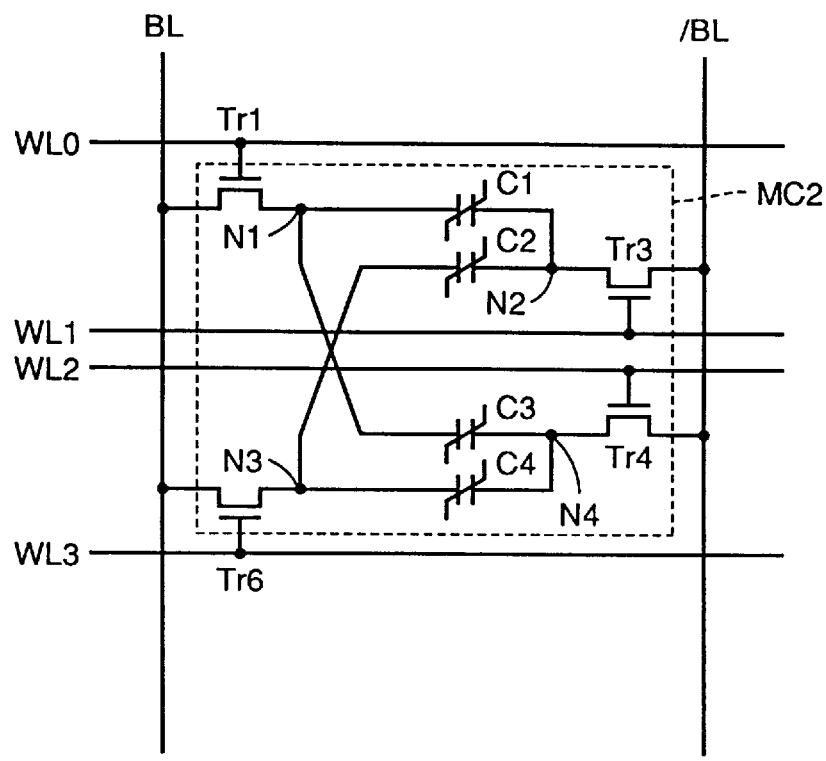
FIGS. 5 and 6 are circuit diagrams showing a structure of a nonvolatile semiconductor memory cell in a nonvolatile semiconductor memory device according to a second embodiment and a third embodiment, respectively, of the present invention.

FIG. 5 is a circuit diagram showing a structure of a nonvolatile semiconductor memory cell corresponding to 4 bits in a nonvolatile semiconductor memory device according to a second embodiment of the present invention. The nonvolatile semiconductor memory device of the second embodiment has a structure similar to that of the nonvolatile semiconductor memory device of the first embodiment shown in FIG. 2.

As shown in FIG. 5, a nonvolatile semiconductor memory cell MC2 of the second embodiment similar in structure to the nonvolatile semiconductor memory cell MC1 of the first embodiment differs in that N channel MOS transistor Tr2 connected between node N1 and ferroelectric capacitor C1, and having a gate connected to word line WL0, and N channel MOS transistor Tr5 connected between node N3 and ferroelectric capacitor C4, and having a gate connected to word line WL3 are absent, and that direct connection is provided between node N1 and ferroelectric capacitor C1, and between node N3 and ferroelectric capacitor C4.

According to nonvolatile semiconductor memory cell MC2 of the second embodiment, the number of transistors required to store data of 1 bit is one. There is an advantage that the chip area can further be reduced than that by nonvolatile semiconductor memory cell MC1 of the first embodiment. However, there is a disadvantage that, when word lines WL0 and WL1 are rendered active to an H level to write data or read data to or from ferroelectric capacitor C1, for example, the path from bit line BL to bit line /BL via node N1, ferroelectric capacitor C3, node N4, ferroelectric capacitor C4, node N3, ferroelectric capacitor C2, and node N2 conducts, so that a voltage of approximately ⅓ the voltage between bit lines BL and /BL is applied to each of ferroelectric capacitors C3, C4 and

Third Embodiment

Figure 6:
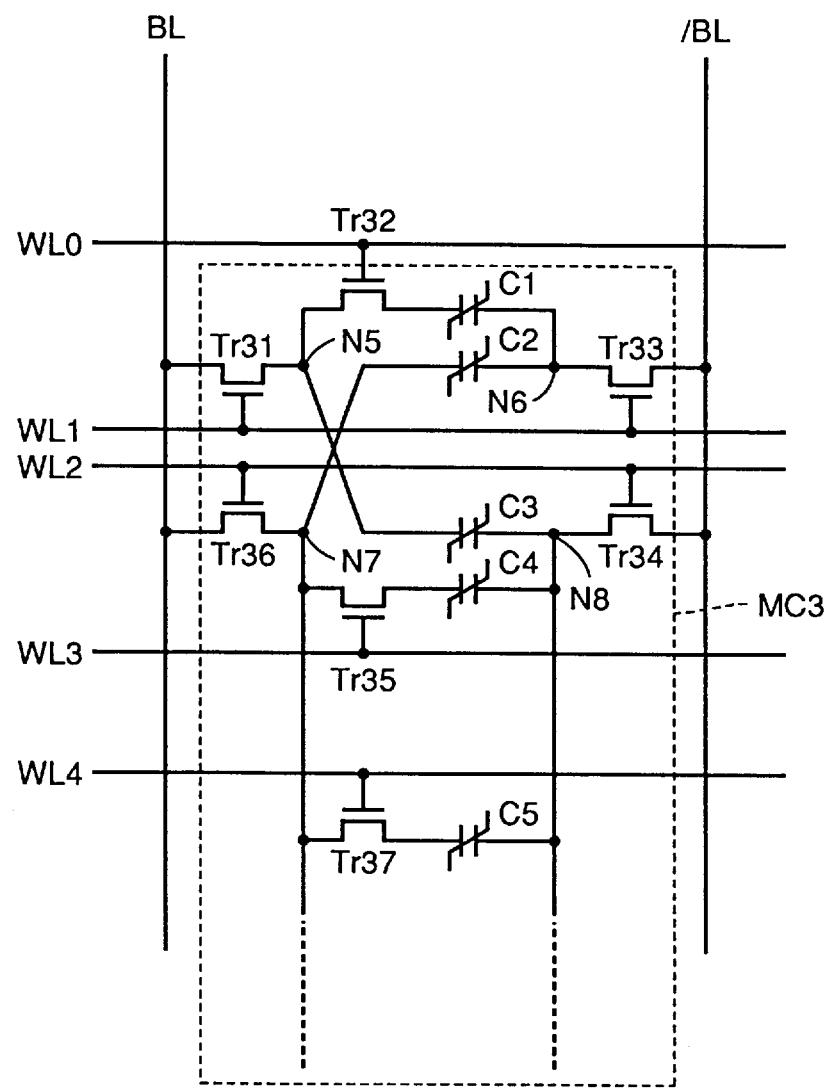

FIG. 6 is a circuit diagram showing a structure of a nonvolatile semiconductor memory cell corresponding to N bits in a nonvolatile semiconductor memory device according to a third embodiment of the present invention.

The nonvolatile semiconductor memory device of the present third embodiment has a structure similar to that of the nonvolatile semiconductor memory device of the first embodiment shown in FIG. 2.

Referring to FIG. 6, a nonvolatile semiconductor memory cell MC3 of the third embodiment includes nodes N5–N8, an N channel MOS transistor Tr31 connected between bit line BL and node N5, and having a gate connected to word line WL1, an N channel MOS transistor Tr32 having a source/drain connected to node N5 and a gate connected to word line WL0, a ferroelectric capacitor C1 connected between N channel MOS transistor Tr32 and node N6, an N channel MOS transistor Tr33 connected between node N6 and bit line /BL, a ferroelectric capacitor C2 connected between nodes N6 and N7, an N channel MOS transistor Tr36 connected between bit line BL and node N7, and having a gate connected to word line WL2, a ferroelectric capacitor C3 connected between node N5 and N8, an N channel MOS transistor Tr34 connected between node N8 and bit line /BL, and having a gate connected to word line WL2, an N channel MOS transistor Tr35 having a source/drain connected to node N7 and a gate connected to word line WL3, a ferroelectric capacitor C4 connected between N channel MOS transistor Tr35 and node N8, an N channel MOS transistor Tr37 having a source/drain connected to node N7 and a gate connected to word line WL4, and a ferroelectric capacitor C5 connected between N channel MOS transistor Tr37 and node NB. Memory cell MC3 further includes an N channel MOS transistor Tr (33+n) (n is an integer of at least 5) having a source/drain connected to node N7 and a gate connected to a word line WLn, and a ferroelectric capacitor C (n+1) connected between N channel MOS transistor Tr(33+n) and node N8.

Since nonvolatile semiconductor memory cell MC3 includes N ferroelectric capacitors C1–Cn, and (N+2) N channel MOS transistors Tr31–Tr(32+N) to store information of N bits, the number of N channel MOS transistors required to store information of 1 bit is reduced if the value of N is increased. However, the parasitic capacitance between nodes N7 and NB will become greater to facilitate noise into the data in writing or reading data to or from the ferroelectric capacitor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a first bit line;
   a second bit line;
   a first word line crossing said first and second bit lines;
   a second word line crossing said first and second bit lines;
   a third word line crossing said first and second bit lines;
   a first ferroelectric capacitor;
   a first transistor connected between said first bit line and said first ferroelectric capacitor, and having a gate connected to said first word line;
   a second transistor connected between said second bit line and said first ferroelectric capacitor, and having a gate connected to said second word line;
   a second ferroelectric capacitor connected between said second transistor and said first bit line; and
   a third transistor connected between said second ferroelectric capacitor and said first bit line, and having a gate connected to said third word line.

2. The nonvolatile semiconductor memory device according to claim 1, further comprising:
   a fourth word line crossing said first and second bit lines;
   a third ferroelectric capacitor connected between said first transistor and said second bit line;
   a fourth transistor connected between said third ferroelectric capacitor and said second bit line, and having a gate connected to said fourth word line; and
   a fourth ferroelectric capacitor connected between said third transistor and said fourth transistor.

3. The nonvolatile semiconductor memory device according to claim 2, further comprising:
   a fifth transistor connected between said first ferroelectric capacitor and said third ferroelectric capacitor, and having a gate connected to said first word line; and
   a sixth transistor connected between said second ferroelectric capacitor and said fourth ferroelectric capacitor, and having a gate connected to said third word line.

4. A nonvolatile semiconductor memory device comprising:
   a first bit line;
   a second bit line;
   a first word line crossing said first and second bit lines;
   a first transistor connected between said first bit line and said second bit line, and having a gate connected to said first word line;
   a plurality of first ferroelectric capacitors connected in parallel between said first transistor and said second bit line;
   a plurality of second transistors, each connected between said first transistor and any one of said plurality of first ferroelectric capacitors; and
   a plurality of second word lines, each crossing said first and second bit lines, and connected to a gate of any one of said plurality of second transistors.

5. The nonvolatile semiconductor memory device according to claim 4, further comprising:
   a second ferroelectric capacitor connected between said first transistor and said second bit line;
   a third word line crossing said first and second bit lines; and
   a third transistor connected between said second ferroelectric capacitor and said second bit line, and having a gate connected to said third word line.

6. The nonvolatile semiconductor memory device according to claim 5, further comprising:
   a third ferroelectric capacitor connected between said third transistor and said first bit line;
   a fourth word line crossing said first and second bit lines; and
   a fourth transistor connected between said third ferroelectric capacitor and said first bit line, and having a gate connected to said fourth word line.

* * * * *